United States Patent [19]
Nagoya et al.

[11] Patent Number: 5,977,838
[45] Date of Patent: Nov. 2, 1999

[54] HIGH-SPEED PHASE-LOCKED LOOP CIRCUIT

[75] Inventors: Yoshinori Nagoya, Yokohama; Yuji Ishida, Fujisawa; Ken Takei, Hachioji, all of Japan

[73] Assignee: Hitachi Ltd., Tokyo, Japan

[21] Appl. No.: 08/840,019

[22] Filed: Apr. 24, 1997

[30] Foreign Application Priority Data

Apr. 26, 1996 [JP] Japan .................................. 8-107413

[51] Int. Cl.[6] .................................................. H03L 7/093
[52] U.S. Cl. ........................... 331/17; 327/157; 331/1 A
[58] Field of Search ................................ 331/25, 16, 17, 331/1 A; 327/157

[56] References Cited

U.S. PATENT DOCUMENTS 5,369,376  11/1994  Leblebicioglu .............................. 331/8

Primary Examiner—Arnold Kinkead
Attorney, Agent, or Firm—Beall Law Offices

[57] ABSTRACT

The present invention designs and implements a high-speed PLL circuit and a high-speed synthesizer using the high-speed PLL circuit which has an increased switching speed, a reduced number of jitters and a reduced magnitude of spurious response. In order to achieve the above, the present invention provides a PLL circuit forming a closed loop wherein: one of the inputs of a phase comparator 1 serves as the input of the PLL circuit and the output of phase comparator 1 is connected to the input of a loop filter 2; the output of loop filter 2 is connected to the input of a voltage-controlled oscillator (VCO) 3; the output of the VCO 3 serves as the output of the PLL circuit; and the output of the VCO 3 is supplied to the other input of phase comparator 1 through a frequency divider 4. The circuit form and circuit constants of loop filter 2 are determined so that the transfer function of the closed loop becomes a Gaussian function.

13 Claims, 4 Drawing Sheets

HIGH-SPEED PHASE-LOCKED LOOP CIRCUIT

BACKGROUND OF THE INVENTION

1. Field of the Invention

The present invention relates to a high-speed phase-locked loop (PLL) circuit. In particular, the present invention relates to the configuration of a PLL circuit applicable to a frequency synthesizer employed typically in a digital portable wireless telephone or other communication equipment and also relates to a high-speed PLL suitable for a high-speed frequency synthesizer capable of responding quickly to a change in desired value of the controlled frequency.

2. Description of the Related Art

As is generally known, a representative application of a PLL (Phase-Locked Loop) circuit is a PLL frequency synthesizer which works as a closed-loop control system comprising a phase comparator, a loop filter, a voltage-controlled oscillator (VCO) and a frequency divider.

With the portable telephone going digital, in the PHS (Personal Handy-Phone System) portable telephone, for example, there is demanded a high-speed PLL frequency synthesizer capable of switching 77 waves with different frequencies in the 1.9-GHz band with a bandwidth of 300 kHz from one to another in a time of the order of milliseconds or even microseconds.

As a technique of configuring a PLL frequency synthesizer embracing the conventional technology, in general, a technique whereby a filter known as a lag-lead filter is used is adopted. This technique is described in detail for example in a document called 'Bell System Technical Journal', May 1980, Pages 127 to 136. Characteristics of a PLL using a loop filter of a circuit disclosed in this document can not be said to be adequate when an application to the contemporary digital radio equipment is taken into account. This is because, normally, an attempt is made to increase the speed of the PLL by using the conventional technology starting with an assumed form of the configuration of a base circuit derived from the intuition and the experience of the design engineer. In this case, a technique is adopted whereby optimal values of elements constituting the configuration of the circuit are found from a numerical analysis carried out by using a computer. With such a technique, however, not only is increasing the speed to a maximum value impossible, but there is also no guarantee that optimal circuit constants can be found by using the numerical searching technique even if the form of the configuration of the base circuit is appropriate as long as the assumed form of the configuration of the base circuit itself can not be used to achieve a maximum speed. As a result, there is raised a problem that a PLL with a sufficiently high speed can not be realized.

SUMMARY OF THE INVENTION

Problems to be Solved by the Invention

In the characteristic of a PLL frequency synthesizer, there are observed two phenomena contrary to each other. In one of the phenomena, when a characteristic of a loop filter is set so as to reduce the number of jitters and the magnitude of a spurious response, the frequency switching speed decreases. In the other phenomenon, on the other hand, an attempt to raise the frequency switching speed increases the number of jitters and the magnitude of the spurious response. It is thus an object of the present invention to implement a high-speed PLL frequency synthesizer capable of increasing the frequency switching speed as well as optimizing the number of jitters and the magnitude of the spurious response. It is another object of the present invention to enable the design and implementation of a high-speed PLL frequency synthesizer applicable to the contemporary radio equipment.

It is a still further object of the present invention to establish a method for optimizing the form of the circuit configuration of a loop filter employed in the high-speed PLL and for determining optimum circuit constants of the circuit.

Means for Solving the Problems

There are two factors in the design of a high-speed PLL: a high-speedness and automatic control of the PLL.

First of all, the high-speedness of a PLL is described. There are two restrictions on the high-speedness of the PLL: a restriction imposed by noise and a restriction caused by sampling carried out in a phase comparator. Basically, the operating speed of a system in which noise exists and the accuracy of a result obtained at the output terminal of the system are in a relation of being contradictory to each other. To be more specific, a high speed and high accuracy of a system can not be achieved at the same time. In addition, conversion into a high speed ignoring the sampling theory can not be implemented.

As for the automatic control, closed-loop control is generally prevalent and the stability of the control loop is thus a problem.

The problems related to the high-speedness and the automatic control are solved not by designing a PLL circuit after analyzing what the characteristic of a control loop will be when the control loop is closed. Instead, the problems are solved by finding the characteristic of a closed loop reversely from a given most desirable control characteristic and then designing a loop filter for implementing the characteristic of the closed loop.

The fact that, in a system including noise with a flat frequency characteristic, the Gaussian characteristic is a characteristic with a most effective noise suppressing effect and a highest operating speed has been clarified in the automatic-control field. It is thus quite within the bounds of possibility that, by adopting this characteristic in a closed-loop control system of a PLL circuit, a PLL circuit with a highest speed can be configured.

The most fundamental feature of the present invention is a discovery of the fact that, in a PLL circuit having a closed-loop portion, by making the transfer characteristic of the whole PLL circuit all but a Gaussian characteristic, the PLL circuit can be configured so that the closed-loop transfer characteristic of the closed-loop portion is also a Gaussian characteristic, allowing an optimum configuration of the closed-loop portion to be implemented.

The present invention has a variety of other features in a number of aspects which are described as follows.

According to a first aspect of the present invention, a PLL circuit having a closed-loop portion is configured so that a closed-loop transfer characteristic of the closed-loop portion is created into substantially a Gaussian characteristic.

According to a second aspect of the present invention, in a high-speed PLL circuit having a closed-loop portion, a loop filter thereof is configured so that a closed-loop transfer characteristic of the closed-loop portion is created into substantially a Gaussian characteristic.

According to a third aspect of the present invention, in a high-speed PLL circuit having a closed-loop portion including a loop filter and a phase comparator, said loop filter is configured so that a closed-loop transfer characteristic of said closed-loop portion is created into substantially a Gaussian characteristic.

According to a fourth aspect of the present invention, in a high-speed PLL circuit having a closed-loop portion including a loop filter and a sample-hold phase comparator, said loop filter is configured so that a closed-loop transfer characteristic of said closed-loop portion is created into substantially a Gaussian characteristic.

According to a fifth aspect of the present invention, in a high-speed PLL circuit having a closed-loop portion including a loop filter and a charge-pump phase comparator, said loop filter is configured so that a closed-loop transfer characteristic of said closed-loop portion is created into substantially a Gaussian characteristic.

According to a sixth aspect of the present invention, in a high-speed PLL circuit described from any one of the first to fifth aspects, a closed-loop transfer function expressing the closed-loop characteristic of said closed-loop portion is the inverses of finite terms of Maclaurin's expansion of the inverse of a Gaussian function.

According to a seventh aspect of the present invention, in a high-speed PLL circuit described from the sixth aspect, said finite terms of Maclaurin's expansion each have an odd degree.

According to an eighth aspect of the present invention, in a high-speed PLL circuit described from the sixth aspect, said finite terms of Maclaurin's expansion each have an odd degree equal to or lower than five.

According to a ninth aspect of the present invention, in a high-speed PLL circuit described from any one of the first to fifth aspects, a closed-loop transfer function expressing the closed-loop characteristic of said closed-loop portion is a product of a Gaussian characteristic and an integration Laplacean operator.

According to a tenth aspect of the present invention, in a high-speed PLL circuit described from any one of the first to fifth aspects, a closed-loop transfer function expressing the closed-loop characteristic of said closed-loop portion is a product of a Gaussian characteristic, an integration Laplacean operator and a Laplacean operator having a first-degree zero point and two first-degree poles.

According to the present invention, it is possible to implement a PLL circuit, the closed-loop transfer function of which is a Gaussian function. For a given degree of a loop filter employed in the PLL circuit, the circuit form can be automatically determined. As a result, it is possible to implement a high-speed PLL circuit which, in principle, has a highest response speed, a smallest number of components and, thus, a least amount of loss.

By employing the high-speed PLL circuit provided by the present invention, it is possible to implement a frequency synthesizer which, in principle, has the highest speed for a given degree of a loop filter employed in the PLL circuit.

The present invention will become more apparent from detailed description of some preferred embodiments implementing a high-speed PLL circuit with reference to the following accompanying diagrams showing the embodiments.

BRIEF DESCRIPTION OF THE DRAWINGS

The above and other objects, features as well as many of attendant advantages of the present invention will be readily appreciated as the same becomes better understood by reference to the following figures showing the embodiments of the present invention wherein.

DETAILED DESCRIPTION OF THE PREFERRED EMBODIMENTS

First of all, a method of designing a circuit for implementing a given transfer function of a Gaussian characteristic is explained.

A Gaussian-characteristic transfer function $G(j\omega)$, which is defined as a ratio of the output to the input, is expressed as a function of angular frequency $\omega$ as follows:

$$|G(j\omega)| = e^{-\omega^2} \quad (1)$$

Equation (1) expresses the absolute value of the transfer function. The square $|G(j\omega)|^2$ of the transfer function $G(j\omega)$ is expressed by Equation 2 as follows:

$$|G(j\omega)|^2 = e^{-2\omega^2} = \frac{1}{\sum_{n=0}^{\infty} \frac{2^n}{n!}\omega^{2n}} = \frac{1}{1 + 2\omega^2 + \frac{2^2}{2!}\omega^4 + \frac{2^3}{3!}\omega^6 + \cdots} \quad (2)$$

In order to design an actual circuit, it is necessary to find a Laplacean transfer function $G(s)$ from $|G(j\omega)|^2$. A procedure for finding the Laplacean transfer function $G(s)$ is explained as follows.

Figure 1:
FIG. 1 is a block diagram showing an ordinary transfer circuit having two pairs of terminals.

The Laplacean transfer function $G(s)$ is defined by Equation (3) as a ratio of $V_{in}(s)$ to $V_{out}(s)$ shown in FIG. 1 where $V_{in}(s)$ and $V_{out}(s)$ are results of a Laplace transform carried out on the real-time functions of the input and output respectively.

$$G(S) \triangleq \frac{V_{out}(s)}{V_{in}(s)} \quad (3)$$

From the character of the definition, $G(s)$ is in general a real-coefficient rational function of the Laplacean operator $s$ of which a conjugate relationship holds true. Accordingly, their zero points and poles are in a conjugate relationship.

$$G(s) = \overline{G(\bar{s})} \quad (4)$$

If $s = j\omega$ is substituted to the function $G(s)$ defined in this way, its absolute value represents a transfer ratio expressed as a function of angular frequency ω and the phase represents a difference in phase between the input and output.

Assuming such a property, the following description explains a procedure for reversely finding the transfer function G(s) from a given absolute value of a transfer ratio expressed as a function of angular frequency ω.

The square of the absolute value of G(jω) can be expressed by Equation 5 as follows.

$$|G(j\omega)|^2 = G(j\omega) \cdot G(-j\omega) = G(s) \cdot G(-s)|_{s=j\omega} \quad (5)$$

The function G(s) can be in general expressed as G(s)=g(s)/h(s) where g(s) and h(s) are each a real-coefficient polynomial expression of s and their roots are conjugate. If the high-degree equations of the numerator and the denominator of G(s)×G(−s) are solved, their roots will be found at locations on the s plane which are symmetrical with respect to the horizontal and vertical axes. From these locations, zero points and poles of G(s) are determined. From the zero points and the poles which are symmetrical with respect to the horizontal and vertical axes, either conjugate pairs on the right side or conjugate pairs on the left side of the s plane are selected and G(s) is synthesized from the combinations. From a condition that G(s) must be stable instead of being oscillatory, the pairs are selected so that the poles are located on the left half of the s plane excluding the imaginary axis of the s plane. As for the zero points, virtually there is no restriction. In order to make a minimum phase transition type, however, the pairs are selected so that the zero points are located on the left half of the s plane including the imaginary axis of the s plane.

The square of the absolute value of G(jω) can be expressed by Equation 6 in terms of g(jω) and h(jω) as follows.

$$|G(j\omega)|^2 = \frac{g(j\omega) \cdot g(-j\omega)}{h(j\omega) \cdot h(-j\omega)} = \frac{g(s) \cdot g(-s)}{h(s) \cdot h(-s)}\bigg|_{s=j\omega} \quad (6)$$

Now, since g(s) and h(s) are each a real-coefficient polynomial of the Laplacean operator s, they can be treated by dividing each of them into an even portion and an odd portion. For example, in the case of g(s), Eqs. (7), (8) and (9) hold true. It should be noted that similar equations obviously hold true of h(s). In order to avoid complexity, however, the description of the equations for h(s) is omitted.

$$g(s) = g_{odd}(s) + g_{even}(s) \quad (7)$$

$$g(-s) = g_{odd}(-s) + g_{even}(-s) = -g_{odd}(s) + g_{even}(s) \quad (8)$$

$$g(s) \cdot g(-s) = (g_{odd}(s) + g_{even}(s)) \cdot (-g_{odd}(s) + g_{even}(s)) \quad (9)$$
$$= -g_{odd}^2(s) + g_{even}^2(s)$$

By the way, the square of an odd polynomial and the square of an even polynomial is an even polynomial. Thus, g(s)×g(−s) is also an even polynomial of the Laplacean operator s which can be expressed by Equation 10 as follows.

$$g(s) \cdot g(-s) = \sum_{k=0}^{m} a_{2k} \cdot s^{2k} = a_0 + a_2 \cdot s^2 + a_4 \cdot s^4 + a_6 \cdot s^6 + \cdots \quad (10)$$

$$= a_0 + a_4 \cdot s^4 + \cdots + a_2 \cdot s^2 + a_6 \cdot s^6 + \cdots$$

-continued
$$= \sum_{l=0}^{m1} a_{4l} \cdot s^{4l} + \sum_{l=0}^{m2} a_{4l+2} \cdot s^{4l+2}$$

From Equation (10), Equation (11) can be derived to express g(jω)×g(−jω) as follows.

$$g(j\omega) \cdot g(-j\omega) = a_0 - a_2 \cdot \omega^2 + a_4 \cdot \omega^4 - a_6 \cdot \omega^6 + \cdots \quad (11)$$

$$= \sum_{l=0}^{m1} a_{4l} \cdot \omega^{4l} - \sum_{l=0}^{m2} a_{4l+2} \cdot \omega^{4l+2}$$

By comparing Equation (10) expressing a function of s with Equation (11) expressing a function of jω, it is obvious that the sign of the coefficient of the term of the (4l+2)th power in the former is opposite to the sign of the corresponding term in the latter.

As described above, Eqs. (7) to (11) hold true of h(s), h(−s), h(s)×h(−s) and h(jω)×h(−jω).

Accordingly, in order to find the initial desired function G(s), that is, g(s) and h(s), the signs of the coefficients of the terms of the (4l+2)th power in |g(jω)|² and |h(jω)|² are inverted and the operator jω is replaced by the Laplacean operator s. Then, by solving two high-degree equations expressed by Eqs. (12) and (13), G(s) can be found.

$$h(s) \cdot h(-s) = 0 \quad (12)$$

$$g(s) \cdot g(-s) = 0 \quad (13)$$

For n=2, for example, |G(jω)|² can be expressed by Equation (14).

$$|G(j\omega)|^2 = \frac{1}{1 + 2\omega^2 + \frac{2^2}{2!}\omega^4} \quad (14)$$

From Equation (14), G(s)×G(−s) can be found as Equation (15) given below.

$$G(s) \cdot G(-s) = \frac{1}{1 - 2s^2 + 2s^4} \quad (15)$$

$$= \frac{1}{2(s + .7769 + j.3218) \cdot (s + .7769 - j.3218)} \times$$

$$\frac{1}{(s.7769 + j.3218) \cdot (s - .7769 - j.3218)}$$

Thus, if the assurance of stability is taken into consideration as a condition, by collecting poles on the left half of the s plane excluding the imaginary axis, the desired function G(s) expressed by Equation (16) can be obtained.

$$G(s) = \frac{1}{\sqrt{2}(s + .7769 + j.3218) \cdot (s + .7769 - j.3218)} \quad (16)$$

$$= \frac{0.7071}{s^2 + 1.5538s + 0.7071}$$

By the same token, for n=10, |G(jω)|² can be expressed by Equation (17).

$$|G(j\omega)|^2 = \left(1 + 2\omega^2 + \frac{2^2}{2!}\omega^4 + \frac{2^3}{3!}\omega^6 + \frac{2^4}{4!}\omega^8 + \frac{2^5}{5!}\omega^{10} + \frac{2^6}{6!}\omega^{12} + \frac{2^7}{7!}\omega^{14} + \frac{2^8}{8!}\omega^{16} + \frac{2^9}{9!}\omega^{18} + \frac{2^{10}}{10!}\omega^{20}\right)^{-1} \quad (17)$$

Thus, from Equation (17), G(s)×G(−s) can be found as Equation (18) given below.

$$G(s) = \frac{1}{(s^2 + 2.6133s + 1.9070)\cdot(s^2 + 2.6822s + 1.8202)} \times \frac{59.5294}{(s^2 + 2.4659s + 2.1046)} \times \frac{1}{(s^2 + 1.7849s + 3.2803)\cdot(s^2 + 2.2140s + 2.4841)} \quad (18)$$

The values of five poles s1, s2, s3, s4 and s5 of Equation (18) are given by Equation (19) as follows.

$s1 = -1.3867 \pm j.4468$ $s2 = -1.3411 \pm j.1472$ $s3 = -1.2330 \pm j.7645$ $s4 = -0.8924 \pm j1.5760$ $s5 = -1.1070 = j1.1219 \quad (19)$ As described above, the Gaussian characteristic is an optimum transfer characteristic of a whole control system and, for a transfer characteristic given as a Gaussian function of angular frequency ω, a method of finding a Laplace function for expressing the transfer function has been explained. Next, a method of finding a closed-loop characteristic for implementing the Gaussian characteristic of the whole control system including a closed-loop portion such as a PLL circuit is explained.

Figure 2:
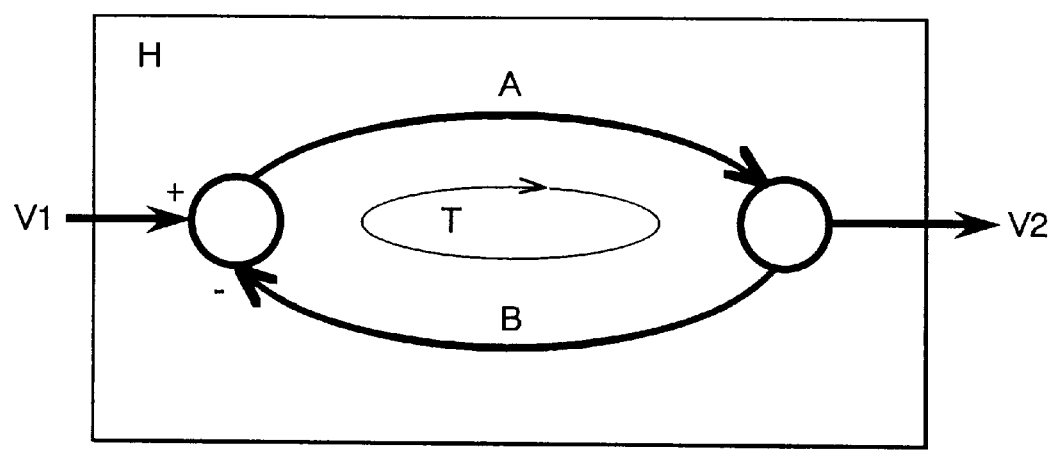
FIG. 2 is a block diagram showing a simplified transfer circuit with two pairs of terminals including a closed loop.

Let the transfer characteristic H of a control system having a closed-loop portion T comprising a feed-forward path A and a feedback path B as shown in FIG. 2 be expressed by Equation 20 as follows.

$$H = \frac{V2}{V1} = \frac{A}{1+A\cdot B} = \frac{A}{1+T} = \frac{T}{1+T}\cdot\frac{1}{B} \qquad T = A\cdot B \quad (20)$$

In general, in many cases, the characteristic of an open loop comprising the feed-forward path A and the feedback path B is a function of complex frequency s while the characteristic of the feedback path B is a constant independent of the complex frequency s. In the following description, notation T is used also to denote the characteristic of the open loop comprising the feed-forward path A and the feedback path B while notation B is used to denote the characteristic of the feedback path B.

Assume that the characteristic T is expressed by Equation (21) as follows.

$$T = \frac{b_0}{s^N + b_1\cdot s^{N-1} + b_2\cdot s^{N-2} + \cdots + b_N} \quad (21)$$

From Eqs. (20) and (21), Equation (22) can be derived to express the transfer characteristic H of the control system as follows.

$$H = \frac{T}{1+T}\cdot\frac{1}{B} = \frac{b_0}{s^N + b_1\cdot s^{N-1} + b_2\cdot s^{N-2} + \cdots + b_N + b_0}\cdot\frac{1}{B} \quad (22)$$

By the way, the Gaussian characteristic G approximated by Maclaurin's expansion of the Nth degree can be expressed by Equation 23 as follows.

$$G = \frac{a_N}{s^N + a_1\cdot s^{N-1} + a_2\cdot s^{N-2} + \cdots + a_N} \quad (23)$$

Comparing Equation (22) with Equation (23), Equation (22) expressing the transfer characteristic H can be modified to Equation (24) as follows.

$$H = \frac{b_N + b_0}{s^N + b_1\cdot s^{N-1} + b_2\cdot s^{N-2} + \cdots + b_N + b_0}\cdot\frac{b_0}{b_N + b_0}\cdot\frac{1}{B} \quad (24)$$

Next, the following substitution is made.

$b_1 = a_1, b_2 = a_2, b_{N-1} = a_{N-1}, b_N + b_0 = a_N$

The above substitution changes the transfer characteristic H to Equation (25) as follows.

$$H = \frac{a_N}{s^N + a_1\cdot s^{N-1} + a_2\cdot s^{N-2} + \cdots + a_N}\cdot\frac{b_0}{b_N + b_0}\cdot\frac{1}{B}$$
$$= G\cdot\frac{b_0}{b_N + b_0}\cdot\frac{1}{B} \quad (25)$$

With the characteristic B of the feedback path assumed to be a constant as described above, it is obvious from Equation (25) that the transfer characteristic H is also Gaussian if G is Gaussian. The only difference between G and H is the amplitude of the response output.

By the way, T(0), the direct-current value of T, can be derived from Equation (21) into Equation (26) as follows.

$$T(0) = \frac{b_0}{b_N} \quad (26)$$

From Equation (26) and the relation bn+b0=an, Eqs. (27) and (28) are obtained.

$$b_N = \frac{a_N}{1+T(0)} \quad (27)$$

$$b_0 = b_N\cdot T(0) = \frac{T(0)}{1+T(0)}\cdot a_N \quad (28)$$

Substituting bn and b0 expressed by Eqs. (27) and (28) respectively to Equation (20) yields Equation (29) expressing T.

$$T = \frac{1}{s^N + a_1\cdot s^{N-1} + a_2\cdot s^{N-2} + \cdots + \frac{a_N}{1+T(0)}}\cdot\frac{T(0)}{1+T(0)}\cdot a_N \quad (29)$$

Here, T(0) has a significant value having something to do with the control performance of an automatic control system. In the case of an AGC (Automatic Gain Control), a variation in input is compressed to a variation in output of 1/(1+T(0)) times the input variation. Therefore, T(0) is found from the requested specification in order to determine T.

The example of the characteristic T of an open loop comprising the feed-forward path A and the feedback path B expressed by Equation (20) or (29) can be applied to a case in which the direct-current value T(0) of the open loop is a limited value of 0. However, it can not be applied to a case in which T(0) approaches the infinity due to the fact that the control loop such as a PLL circuit includes essentially an integrating element. For this reason, the following description explains a procedure for finding the characteristic T of the open loop for a PLL circuit.

Figure 3:
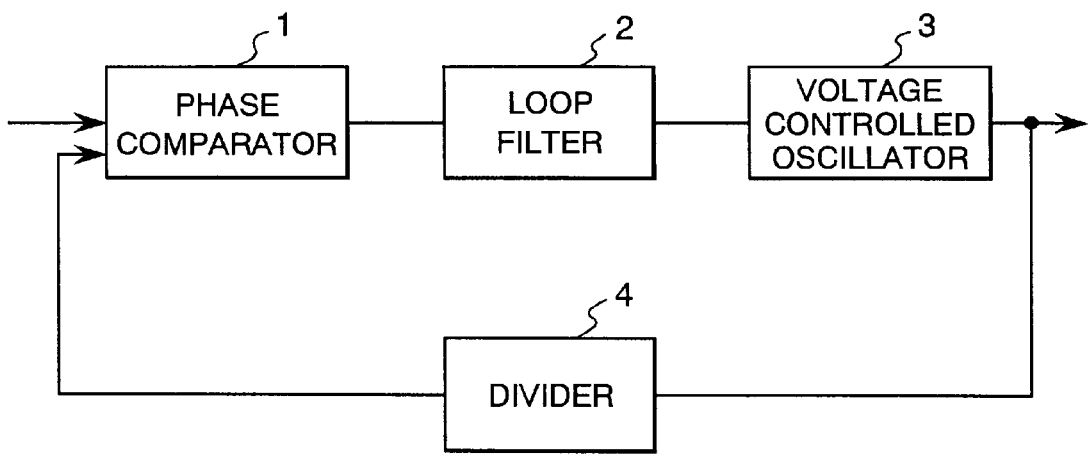
FIG. 3 is a block diagram showing a PLL circuit provided by the present invention.

FIG. 3 is a block diagram showing the basic configuration of a PLL circuit. As shown in the figure, one of the inputs of a phase comparator 1 serves as the input of the PLL circuit and the output of the phase comparator 2 is connected to the input of a loop filter 2. The output of the loop filter 2 is connected to the input of a voltage-controlled oscillator (VCO) 3. The output of the VCO 3 is the output of the PLL circuit. The output of the VCO 3 is supplied to the other input of the phase comparator 1 through a frequency divider 4.

As shown in the figure, in general, a PLL circuit has a closed-loop portion which comprises the phase comparator 1, the loop filter 2 and the VCO (Voltage-Controlled Oscillator) 3 which serve as a feed-forward path and the frequency divider 4 serving as a feedback path. In the case of a PLL circuit with a configuration having a closed-loop portion, an integrating element is included for interpreting and changing the frequency and phase in the VCO. It is thus necessary to add a factor representing the integrating characteristic to the right-hand side of Equation (21) of the characteristic T of the open loop given previously. As a representative phase comparator 1, a sample-hold phase comparator and a charge-pump phase comparator are available. The following description explains procedures for finding the open-loop characteristic T for a sample-hold phase comparator and a charge-pump phase comparator.

First of all, in the case of a sample-hold phase comparator, the integrating factor is 1/s. Thus, the open-loop characteristic T is expressed by Equation 30 as follows.

$$T = \frac{b_0}{s(s^N + b_1 \cdot s^{N-1} + b_2 \cdot s^{N-2} + \cdots + b_N)} \quad (30)$$

Substituting Equation (30) to a function of T expressing H yields Equation (31) expressing H as follows.

$$H = \frac{T}{1+T} \cdot \frac{1}{B} \quad (31)$$

$$= \frac{b_0}{s^{N+1} + b_1 \cdot s^N + b_2 \cdot s^{N-1} + \cdots + b_N \cdot s + b_0} \cdot \frac{1}{B}$$

Comparison of Equation (31) with a Gaussian characteristic approximated by Maclaurin's expansion of the (N+1)th degree results in Equation (32) expressing H as follows.

$$H = \frac{a_{N+1}}{s^{N+1} + a_1 \cdot s^N + a_2 \cdot s^{N-1} + \cdots + a_N \cdot s + a_{N+1}} \cdot \frac{1}{B} \quad (32)$$

Thus, the open-loop characteristic T which presents a Gaussian characteristic is expressed by Equation (33).

$$T = \frac{a_{N+1}}{s(s^N + a_1 \cdot s^{N-1} + a_2 \cdot s^{N-2} + \cdots + a_N)} \quad (33)$$

In the case of a charge-pump phase comparator, on the other hand, an integrating element for charging is further included in addition to the integrating element for interpreting and changing the frequency and phase in the VCO described earlier. As a result, the automatic control system oscillates up to the first-degree integrating factor. In order to prevent the oscillation, it is necessary to restore the phase in the neighborhood of a zone in which the control-loop gain is 0 decibel. For this purpose, a so-called lag-lead filter with a characteristic (s+a)/(s+b) is added. As a result, the open-loop characteristic T with such a lag-lead filter added is expressed by Equation (34).

$$T = \frac{s+a}{s(s+b)} \cdot \frac{b_0}{s(s^N + b_1 \cdot s^{N-1} + b_2 \cdot s^{N-2} + \cdots + b_N)} \quad (34)$$

$$\equiv A_1 \cdot \frac{s+a}{s^2 \cdot u(s)}$$

Equation (35) expressing H can be derived in the same way as a sample-hold phase comparator as follows.

$$H = \frac{T}{1+T} \cdot \frac{1}{B} = \frac{A_1(s+a)}{s^2 \cdot u(s) + A_1 \cdot s + A_1 \cdot a} \cdot \frac{1}{B} \quad (35)$$

With respect to locations of poles of H expressed by Equation (35), comparison of Equation (35) with a Gaussian characteristic approximated by Maclaurin's expansion of the (N+2)th degree results in Equation (36) expressing H as follows.

$$H = \frac{a_{N+1}\left(s + \frac{a_{N+2}}{a_{N+1}}\right)}{s^{N+2} + a_1 \cdot s^{N+1} + a_2 \cdot s^N + \cdots + a_{N+1} \cdot s + a_{N+2}} \cdot \frac{1}{B} \quad (36)$$

Thus, the open-loop characteristic T which presents a Gaussian characteristic is expressed by Equation (37).

$$T = \frac{a_{N+1}\left(s + \frac{a_{N+2}}{a_{N+1}}\right)}{s^{N+2} + a_1 \cdot s^{N+1} + a_2 \cdot s^N + \cdots + a_N \cdot s^2} \quad (37)$$

$$= \frac{a_{N+1}\left(s + \frac{a_{N+2}}{a_{N+1}}\right)}{s^2(s^N + a_1 \cdot s^{N-1} + a_2 \cdot s^{N-2} + \cdots + a_N)}$$

It should be noted that zero points of H are considered as follows. The output response of the transfer function H is an attenuated oscillation with poles of H serving as complex frequencies thereof. In this case, a zero point merely plays a role of determining the phase and amplitude of the attenuated oscillation. A zero point does not have something to do with the frequency and the time constant of the attenuated oscillation. As a result, in the case of a charge-pump phase comparator, even though the transfer function is not a Gaussian characteristic, a zero point does not have something to do with the attenuation time constant of the time response. Thus, a control system is built by making only poles of H match those of a Gaussian function.

By designing a PLL in accordance with a design methodology described above, it is possible to implement a high-speed PLL circuit employing a phase comparator of a sample-hold type or an exclusive-logical-sum type or a multiplier type equivalent to the sample-hold type as far as an integrating effect is concerned except for the fact that the Gaussian characteristic thereof is approximated by limited Maclaurin's expansion or employing a phase comparator of a charge-pump type, wherein the form of the circuit and circuit constants which in principle maximize the speed of the PLL circuit are determined unequivocally.

First Embodiment

Next, the present invention is explained in a more concrete way through preferred embodiments.

Figure 4:
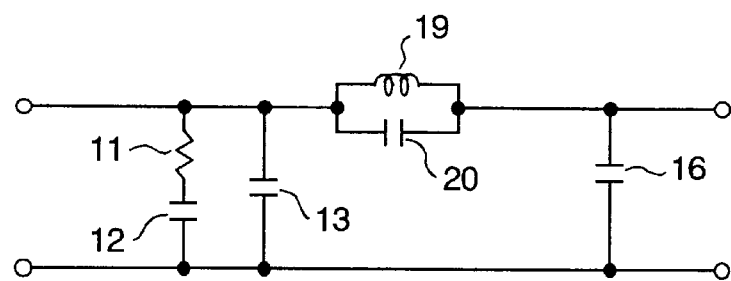
FIG. 4 is a circuit diagram showing a loop filter for use in a high-speed PLL circuit having a charge-pump phase comparator provided by a first embodiment of the present invention.

FIG. 4 is a circuit diagram showing a loop filter 2 used in a first embodiment implementing a high-speed PLL circuit provided by the present invention wherein a charge-pump phase comparator is employed as the phase comparator 1 in the PLL circuit shown in FIG. 3. As shown in the figure, a series circuit is connected in parallel to input pins. The series circuit comprises a resistor 11 and a capacitor 12. After the series circuit, a capacitor 13 is connected in parallel. The capacitor 13 is followed by a parallel circuit connected in series. The parallel circuit comprises a capacitor 20 and an inductor 19. After the parallel circuit, a capacitor 16 is connected in parallel to provide a fifth-degree filter. The circuit form of the fifth-degree filter shown in FIG. 4 is expressed by Equation (34) through Equation (38) given below, that is, the circuit form satisfying these equations is automatically determined so that the closed-loop transfer function of the PLL circuit shown in FIG. 3 exhibits a Gaussian characteristic.

$$T = \frac{s+a}{s(s+b)} \cdot \frac{b_0}{s(s^2 + b_1 \cdot s + b_2)} \tag{38}$$

Figure 5:
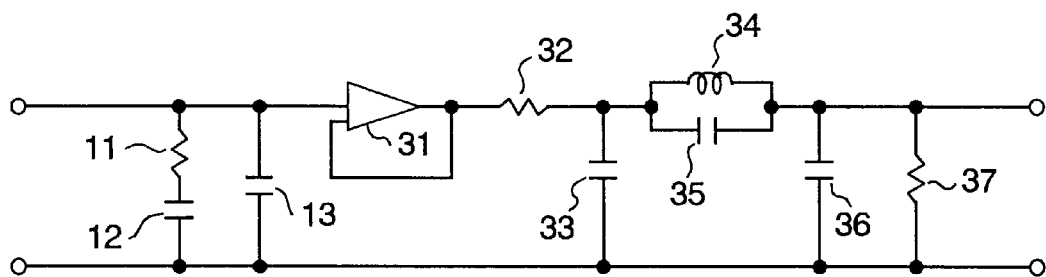
FIG. 5 is a circuit diagram showing a loop filter for use in a high-speed PLL circuit having a charge-pump phase comparator adopting the prior art.

FIG. 5 is a diagram showing a loop filter adopting the conventional technology. The conventional loop filter shown in FIG. 5 corresponds to the loop filter of the present invention shown in FIG. 4. As shown in FIG. 5, a series circuit is connected in parallel to input pins. The series circuit comprises a resistor 11 and a capacitor 12. After the series circuit, a capacitor 13 is connected in parallel. The capacitor 13 is followed by a buffer amplifier 31 connected in series, a resistor 32 connected in series and a capacitor 33 connected in series. The capacitor 33 is followed by a parallel circuit connected in series. The parallel circuit comprises a capacitor 35 and an inductor 34. After the parallel circuit, a capacitor 36 is connected in parallel to be followed by a resistor 37 to form a sixth-degree filter.

By selecting an even degree for the filter, the degree of the high-degree polynomial of the later part of the fraction denominator of Equation (34) is odd. In this case, since a capacitor connected in parallel to the input pins of the loop filter 2 of the filter circuit satisfying the closed-loop transfer function T is eliminated, when a pulse signal component is applied to the loop filter 2, the pulse waveform can not be smoothed. As a result, the operation of the closed loop is prone to instability which is not desirable. That is to say, in the case of a charge-pump phase comparator, the output of the charge-pump circuit can be regarded as a current source so that a loop filter connected directly to the output of the charge-pump circuit is desirable for enhancement of the power-transmission efficiency. Accordingly, since it is necessary to insert a capacitor in parallel to the input pins of the loop filter for smoothing the output of the charge-pump circuit, in the case of a PLL circuit employing a charge-pump phase comparator, the loop filter is required to have an odd degree.

In the case of a PLL circuit of the conventional technology employing the loop filter as shown in FIG. 5, it is in principle impossible to make the transfer function a Gaussian function from the circuit form. As a result, the operating speed is basically low in comparison with the PLL provided by the present invention. According to the first embodiment of the present invention shown in FIG. 4, on the other hand, it is possible to make the closed-loop transfer function of the PLL, which employs a charge-pump phase comparator, a Gaussian function, resulting in an effect that a PLL operation can be realized for stabilizing a signal propagating the loop at a high speed.

Figure 6:
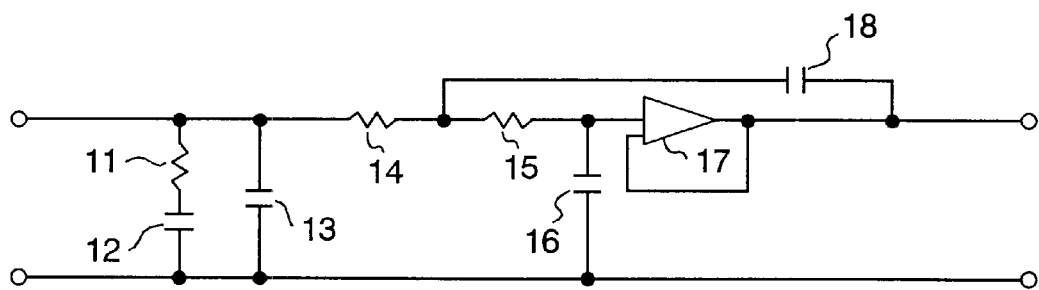
FIG. 6 is a circuit diagram showing a loop filter for use in a high-speed PLL circuit having a charge-pump phase comparator provided by a second embodiment of the present invention.

A second embodiment of the present invention is explained by referring to FIG. 6 as follows. In the second embodiment, an operation equivalent to the loop filter shown in FIG. 4 can be implemented without using an inductor, that is, the inductor 19 shown in FIG. 4. As shown in FIG. 6, a series circuit comprising a resistor 11 and a capacitor 12 is connected in parallel to input pins. After the series circuit, a capacitor 13 is connected in parallel. The capacitor 13 is followed by a resistor 14 connected in series, a resistor 15 connected in series and a capacitor 16 connected in parallel and a buffer amplifier 17 connected in series. The output of the buffer amplifier 17 is connected to the output of the loop filter. A feedback capacitor 18 is connected between the output of the loop filter and the junction point between the resistors 14 and 15. As described above, in the second embodiment, an operation equivalent to the loop filter shown in FIG. 4 can be implemented without using an inductor as is obvious from FIG. 6. As a result, the circuit of the loop filter can be made small in size, resulting in an effect that conversion of the circuit into an integrated circuit is easy to implement.

Figure 7:
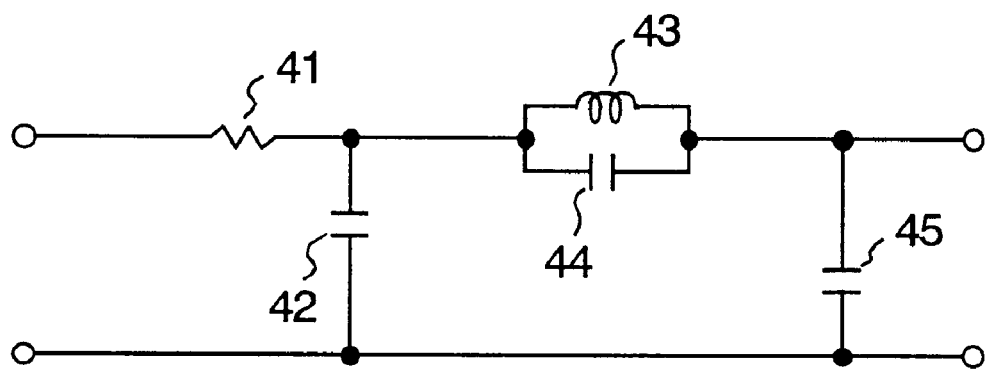
FIG. 7 is a circuit diagram showing a loop filter for use in a high-speed PLL circuit having a sample-hold phase comparator provided by a third embodiment of the present invention.

A third embodiment of the present invention is explained by referring to FIG. 7 as follows. The third embodiment implements a typical configuration of a loop filter for a case in which a sample-hold phase comparator is used as the phase comparator 1 of the PLL circuit shown in the configuration diagram of FIG. 3. As shown in FIG. 7, a resistor 41 is connected in series to the input pins to be followed by a capacitor 42 connected in parallel, a parallel circuit connected in series and a capacitor 46 connected in parallel. The parallel circuit comprises a capacitor 44 and an inductor 43. With a sample-hold phase comparator used as the phase comparator 1 of the loop filter 2, the output of a sample-hold circuit employed in the phase comparator 1 can be regarded as combination of a voltage source and a load resistor connected to the voltage source. With such an arrangement, it is possible to solve the problem that the closed-loop circuit becomes unstable for a pulse signal like the one observed in a charge-pump circuit. It should be noted that the sample-hold circuit itself is not shown in the figure. Thus, the degree of the loop filter shown in FIG. 7 is four and the closed-loop transfer function T exhibiting a Gaussian characteristic is expressed by Equation 39. The circuit form is automatically determined as shown in FIG. 7.

$$T = \frac{s+a}{s(s+b)} \cdot \frac{b_0}{s(s+b_1)} \tag{39}$$

According to the third embodiment, the closed-loop transfer function T of a PLL circuit employing a sample-hold phase comparator can be made a Gaussian function, resulting an effect that it is possible to implement a PLL operation that stabilizes a signal propagating through the loop at a high speed.

The entire disclosure of Japanese Patent Application No. 8-107413 filed on Apr. 26, 1996 including a specification, claims, drawings and a summary is incorporated herein by reference in its entirety.

What is claimed is:

1. A method for designing a closed loop circuit having a transmission path for series connection of a phase comparator, a loop filter and a voltage controlled oscillator, and a feed-back path including a divider, wherein, a characteristic of said loop filter is determined by the steps of:

calculating a value of a pole in advance from a conjugate condition in reference to a general equation expressing a Gaussian characteristic;

determining a degree of a transfer function of a closed loop;

removing a characteristic value of circuits other than said loop filter constituting said closed loop from the transfer function of said closed loop, wherein since the transfer function of the closed loop multiplies the characteristic of each of the circuits constituting the closed loop such as at least a phase comparator, filter and VCO, if the transfer function of the entire closed loop is determined, a characteristic of the circuit other than the filter is removed with a characteristic of the circuit which cannot be modified such as the phase comparator, VCO being applied in general as a constant in order to calculate the characteristic of the filter; and comparing the value of said pole with the transfer function of said closed loop in accordance with said determined degree.

2. A method according to claim 1, where the degree of the transfer function of the closed loop is an odd number in a case of a charge pump type circuit.

3. A method according to claim 2 wherein the odd number of the degree is equal to or less than five.

4. A method according to claim 1 wherein the degree of the transfer function of the closed loop is an even number in a case of a sample-hold type circuit.

5. A method according to claim 4 wherein the even number of the degree is equal to or less than four.

6. A method according to claim 1 wherein a closed-loop transfer function expressing a closed-loop characteristic of said closed-loop portion is a product of a Gaussian characteristic, and an integration Laplacean operator.

7. A method according to claim 1, wherein a closed-loop transfer function expressing a closed-loop characteristic of said closed-loop portion is a product of a Gaussian characteristic, an integration Laplacean operator, and a Laplacean operator having a first-degree zero point and two first-degree poles.

8. A method according to claim 1 wherein:

a closed-loop transfer function expressing a closed-loop characteristic of said closed-loop portion is a product of a Gaussian characteristic, an integration Laplacean operator, and a Laplacean operator having a first-degree zero point and two first-degree poles; and one of said two first-degree poles is a zero.

9. A charge pump type PLL circuit comprising:

a closed-loop portion including, a transmission path for series connection of a phase comparator which is a charge pump type, a loop filter configured so that a closed-loop transfer characteristic of said closed-loop portion is created into substantially a Gaussian characteristic, a voltage controlled oscillator, and a feed-back path including a divider; and a closed-loop transfer function expressing the closed-loop characteristic of the closed loop portion as an inverse of finite terms of Maclaurin's expansion of the inverse of a Gaussian function, said finite terms of Maclaurin's expansion each having an odd degree.

10. A charge pump type PLL circuit according to claim 9 wherein an odd number of the degree is equal to or less than five.

11. A charge pump type PLL circuit according to claim 9 wherein the closed-loop transfer function expressing a closed-loop characteristic of the closed-loop portion is a product of the Gaussian characteristic, and an integration Laplacean operator.

12. A charge pump type PLL circuit according to claim 9 wherein the closed-loop transfer function expressing a closed-loop characteristic of the closed-loop portion is a product of the Gaussian characteristic, an integration Laplacean operator, and a Laplacean operator having a first-degree zero point and two first-degree poles.

13. A charge pump type PLL circuit according to claim 9 wherein:

the closed-loop transfer function expressing a closed-loop characteristic of the closed-loop portion is a product of the Gaussian characteristic, an integration Laplacean operator and a Laplacean operator having a first-degree zero point and two first-degree poles; and one of said two first-degree poles is a zero.

* * * * *